June 13, 1972 HANS-MARTIN REIN ET AL 3,669,760

METHODS OF PRODUCING DIFFUSION REGIONS IN SEMICONDUCTOR BODIES

Filed Oct. 19, 1970

Inventor:
Hans-Martin Rein
Peter Conze

BY Spencer & Kaye ATTORNEYS.

United States Patent Office 3,669,760
Patented June 13, 1972

3,669,760

METHODS OF PRODUCING DIFFUSION REGIONS IN SEMICONDUCTOR BODIES

Hans-Martin Rein, Heilbronn-Bockingen, and Peter Conze, Massenbach, Germany, assignors to Licentia Patent-Verwaltungs-G.m.b.H., Frankfurt am Main, Germany Filed Oct. 19, 1970, Ser. No. 81,692
Claims priority, application Germany, Oct. 18, 1969, P 19 52 632.0
Int. Cl. H01l 7/54
U.S. Cl. 148—1.5 5 Claims

ABSTRACT OF THE DISCLOSURE

A method of producing a diffusion region in a semiconductor body in which the semiconductor body is covered with an insulating layer, a diffusion window in the insulating layer and a recess in the semiconductor are produced in one operation by ion bombardment and a diffusion region is diffused into the semiconductor body through a wall of the recess.

BACKGROUND OF THE INVENTION

This invention relates to a method of producing a diffusion region in a semiconductor body, wherein the semiconductor body is covered with an insulating layer and a diffusion window is produced in the insulating layer.

SUMMARY OF THE INVENTION

The invention has for its object the method of producing a diffusion region in a semiconductor body in whch the diffusion window in the insulating layer and a recess in the semiconductor body are produced, in one operation, by ion bombardment and in which the diffusion region is diffused into the semiconductor body through a wall of the recess. The ion bombardment is effected, for example, in a sputtering installation.

The invention has the advantage that, by it, clean semiconductor surfaces are obtained in the diffusion area whereas, when the conventional photolacquer etching technique is used, contamination not infrequently occurs in the diffusion window and may be attributed, for example, to residues of photolacquer, silicon dioxide, boron glass or a solvent. A further advantage of the invention consists in that lateral undermining by etching of the semiconductor material below the insulating layer is prevented by ion bombardment. Instead, the invention renders the production of precisely defined recesses possible.

The invention may be used in the manufacture of transistors, in that before the emitter diffusion, not only is a diffusion window introduced into the insulating layer but at the same time a recess is formed in the base region by ion bombardment. The invention is actually based on recognition of the fact that a reduction in the emitter dip effect as well as a steeper emitter profile in the region of the emitter-base p-n junction are obtained by means of such a recess in the base region through the wall of which the emitter region is diffused into the base region. Both improvements have a positive effect on the high-frequency characteristics of the transistor.

The invention is used to advantage, however, not only in the manufacture of the emitter region of a transistor but also for other semiconductor regions, and, for example, also in making contact to semiconductor regions by means of diffusion regions. Thus, when making contact to the collector region of a transistor for example, a second recess is introduced into the semiconductor body and a region of the type of conductivity of the collector region is diffused into the collector region through the wall of the recess. A combination of diffusion with the production of a recess may, in general, be an advantage in making contact to the semiconductor regions.

BRIEF DESCRIPTION OF THE DRAWINGS

The invention will now be further described, by way of example, with reference to the accompanying drawings, in which.

DESCRIPTION OF PREFERRED EMBODIMENT

The drawings show the production of a planar transistor by the method according to the invention for use as a component of an integrated circuit.

Figure 1:
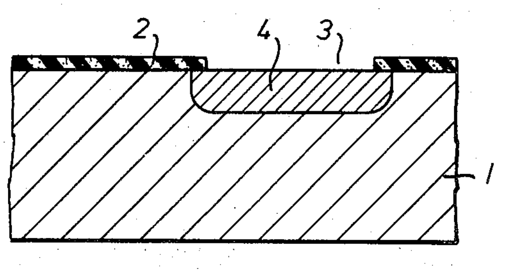
FIG. 1 is a section through a semiconductor body showing the first stage in the production of a diffusion region and FIGS. 2 and 3 are sections, corresponding to FIG. 1, showing further stages in the production of said diffusion region.

Referring now to FIG. 1, the semiconductor body comprises a collector region 1 which consists, for example, of silicon. This semiconductor body is first covered with an insulating layer 2 which consists of silicon dioxide or of silicon nitride for example. As shown in FIG. 1, a base diffusion window 3, through which the base region 4 is diffused into the collector region 1, is introduced into the insulating layer 2. Thus the invention has not yet been used during the production of the base region 4.

After or during the base diffusion, the base diffusion window as shown in FIG. 2 is closed again by means of an insulating layer 5 and an aperture 6 for the emitter diffusion is introduced into this insulating layer. The aperture 6 is not, however, produced by etching, as in the case of the base diffusion window, but by means of ion bombardment. This ion bombardment is so conducted according to the invention that not only a portion of the insulating layer but at the same time semiconductor material from the base region is removed so that the aperture 6 in the insulating layer and the recess 7 in the base region are formed by a single operation. Then the emiter region 8 is diffused into the base region 4 through the wall of the recess 7 as shown in FIG. 3. The emitter diffusion carried out according to the invention leads to a reduction in the emitter dip effect as well as a steeper emitter profile.

In order that only the portion of the insulating layer and the semiconductor body situated in the emitter diffusion area may be struck by the ions during the ion bombardment, a layer of photolacquer for example is applied to the insulating layer and this layer of photolacquer is exposed in a structured manner. After the exposure, only that portion of the photolacquer layer which covers the insulating layer in the emitter diffusion area is dissolved out. The use of the photolacquer technique in conjunction with ion bombardment, also known as ion etching, for producing apertures in the insulating layer and for the removal of semiconductor material according to the invention is an advantage in general.

Figure 2:
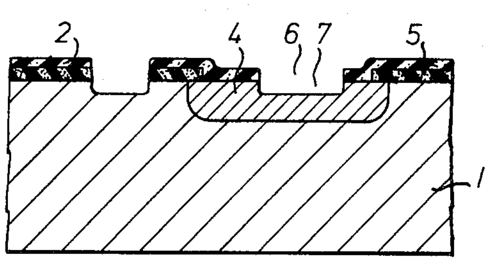
Figure 3:
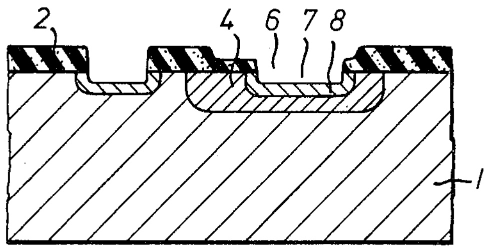

As FIGS. 2 and 3 show, the ion bombardment is carried out in the illustrated example in such a manner that not only the emitter diffusion area of the insulating layer and of the semiconductor body is struck by the ions but also the area for the collector connection. As a result, a collector connection window is formed in the insulating layer as well as a recess in the semiconductor body through the wall of which a diffusion region of the type of conductivity of the collector region is diffused into the collector region.

Although the invention has only been explained with reference to the example of producing a collector connection, the invention is also suitable for producing other connections to a semiconductor body or to semiconductor regions in a semiconductor body. This is particularly the case when it is a question of making contact to semiconductor regions situated relatively deep in the semiconductor body, such as the co-called buried layers.

What is claimed is:

1. A method of producing a diffusion region in a semiconductor body, said method including the steps of covering the semiconductor body with an isulating layer; producing a diffusion window in the insulating layer and a recess in the semiconductor body in one operation by ion bombardment; and diffusing a diffusion region into the semiconductor body through a wall of said recess.

2. A method as claimed in claim 1, in which the diffusion region is an emitter region.

3. A method as claimed in claim 1, in which a second recess is produced in the semiconductor body by ion bombardment and a region of the type of conductivity of a collector region is diffused into the semiconductor body through a wall of said recess to form a collector region.

4. A method as claimed in claim 1, in which said ion bombardment is effected in a sputtering installation.

5. A method as claimed in claim 1, including the additional step of applying a layer of photolacquer to said insulating layer prior to said ion bombardment.

References Cited

UNITED STATES PATENTS

| | | | |
|---|---|---|---|
| 3,178,804 | 4/1965 | Ullery et al. | 29—155.5 |
| 3,179,542 | 4/1965 | Quinn et al. | 148—177 |
| 3,271,286 | 9/1966 | Lepselter | 204—192 |
| 3,340,601 | 9/1967 | Garibotti | 29—582 |
| 3,442,701 | 5/1969 | Lepselter | 117—212 |

L. DEWAYNE RUTLEDGE, Primary Examiner

J. M. DAVIS, Assistant Examiner

U.S. Cl. X.R.

148—187; 204—192; 317—235 AY